United States Patent
Patton et al.

(10) Patent No.: US 7,151,020 B1
(45) Date of Patent: Dec. 19, 2006

(54) CONVERSION OF TRANSITION METAL TO SILICIDE THROUGH BACK END PROCESSING IN INTEGRATED CIRCUIT TECHNOLOGY

(75) Inventors: Jeffrey P. Patton, Santa Clara, CA (US); Austin C. Frenkel, San Jose, CA (US); Thorsten Kammler, Ottendorft-Okrilla (DE); Robert J. Chiu, San Jose, CA (US); Errol Todd Ryan, Wappingers Falls, NY (US); Darin A. Chan, San Francisco, CA (US); Paul R. Besser, Sunnyvale, CA (US); Paul L. King, Mountain View, CA (US); Minh Van Ngo, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 190 days.

(21) Appl. No.: 10/839,437

(22) Filed: May 4, 2004

(51) Int. Cl.
*H01L 21/336* (2006.01)
*H01L 21/44* (2006.01)

(52) U.S. Cl. .................. 438/197; 438/301; 438/655; 438/664

(58) Field of Classification Search ............... 438/197, 438/299, 301, 305, 633, 664, 655
See application file for complete search history.

(56) References Cited

U.S. PATENT DOCUMENTS

| | | | | |
|---|---|---|---|---|
| 5,728,625 | A * | 3/1998 | Tung ........................ | 438/586 |
| 5,741,725 | A * | 4/1998 | Inoue et al. ................ | 438/664 |
| 6,117,689 | A * | 9/2000 | Summerfelt .................. | 438/3 |
| 6,455,420 | B1 * | 9/2002 | Suenaga ..................... | 438/655 |
| 2004/0061184 | A1 * | 4/2004 | Lu et al. ..................... | 257/384 |
| 2004/0256645 | A1 * | 12/2004 | Tsuchiaki et al. ........... | 257/288 |

* cited by examiner

*Primary Examiner*—Michael Trinh
(74) *Attorney, Agent, or Firm*—Mikio Ishimaru

(57) ABSTRACT

A method of forming an integrated circuit with a semiconductor substrate is provided. A gate dielectric is formed on the semiconductor substrate, and a gate is formed on the gate dielectric. Source/drain junctions are formed in the semiconductor substrate. A transition metal layer is formed on the source/drain junctions and on the gate. An interlayer dielectric is formed above the semiconductor substrate. Contacts are then formed in the interlayer dielectric, whereby a silicide is formed from the transition metal layer at a temperature no higher than the maximum temperature at which the interlayer dielectric and the contacts are formed.

10 Claims, 3 Drawing Sheets

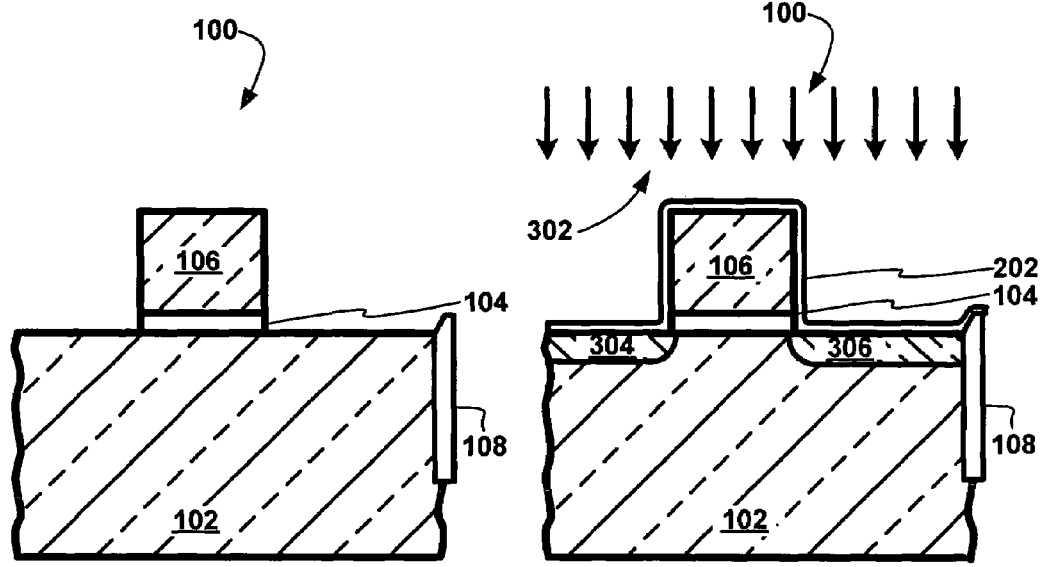
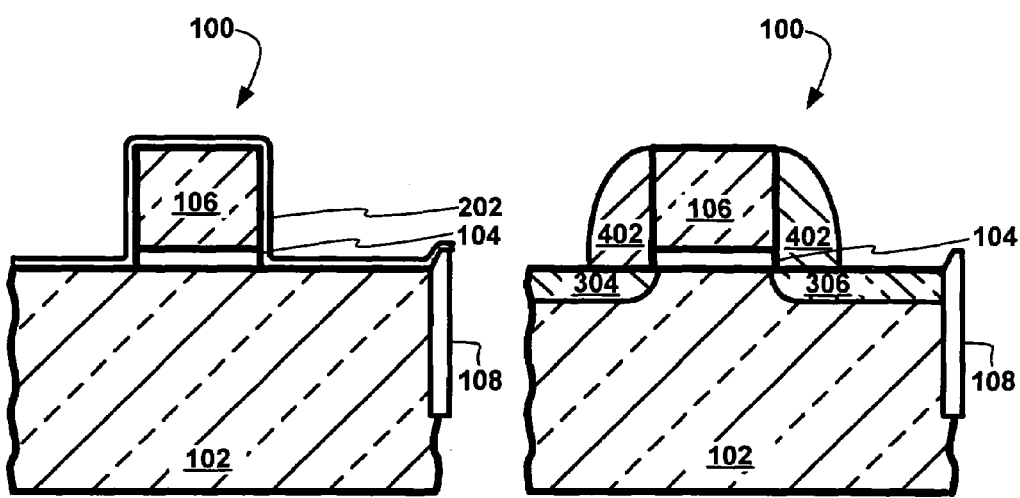
FIG. 1
FIG. 3
FIG. 2
FIG. 4

900

```
┌─────────────────────────────────────────────┐
│   PROVIDING A SEMICONDUCTOR SUBSTRATE       │
│                    902                      │
└─────────────────────────────────────────────┘
                      │
┌─────────────────────────────────────────────┐
│  FORMING A GATE DIELECTRIC ON THE SEMICONDUCTOR │
│                   SUBSTRATE                  │
│                     904                     │
└─────────────────────────────────────────────┘
                      │
┌─────────────────────────────────────────────┐
│     FORMING A GATE ON THE GATE DIELECTRIC   │
│                     906                     │
└─────────────────────────────────────────────┘
                      │
┌─────────────────────────────────────────────┐
│ FORMING SOURCE/DRAIN JUNCTIONS IN THE SEMICONDUCTOR │
│                  SUBSTRATE                  │
│                     908                     │
└─────────────────────────────────────────────┘
                      │
┌─────────────────────────────────────────────┐
│ FORMING A TRANSITION METAL LAYER ON THE SOURCE/DRAIN │
│            JUNCTIONS AND ON THE GATE         │
│                     910                     │
└─────────────────────────────────────────────┘
                      │
┌─────────────────────────────────────────────┐
│   FORMING AN INTERLAYER DIELECTRIC ABOVE THE │
│            SEMICONDUCTOR SUBSTRATE           │
└─────────────────────────────────────────────┘
                      │
┌─────────────────────────────────────────────┐
│ FORMING CONTACTS IN THE INTERLAYER DIELECTRIC, WHEREBY │
│ A SILICIDE IS FORMED FROM THE TRANSITION METAL LAYER AT A │
│  REDUCED TEMPERATURE NO HIGHER THAN THE MAXIMUM │
│ TEMPERATURE AT WHICH THE INTERLAYER DIELECTRIC AND THE │
│             CONTACTS ARE FORMED             │
│                     914                     │
└─────────────────────────────────────────────┘
```

FIG. 9

CONVERSION OF TRANSITION METAL TO SILICIDE THROUGH BACK END PROCESSING IN INTEGRATED CIRCUIT TECHNOLOGY

BACKGROUND

1. Technical Field

The present invention relates generally to semiconductor technology, and more specifically to siliciding in semiconductor devices.

2. Background Art

Electronic products are used in almost every aspect of life, and the heart of these electronic products is the integrated circuit. Integrated circuits are used in everything from airplanes and televisions to wristwatches.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each worth hundreds or thousands of dollars.

Integrated circuits are made up of hundreds to millions of individual components. One common component is the semiconductor transistor. The most common and important semiconductor technology presently used is silicon-based, and the most preferred silicon-based semiconductor device is a Complementary Metal Oxide Semiconductor (CMOS) transistor.

The principal elements of a CMOS transistor generally consist of a silicon substrate having shallow trench oxide isolation regions cordoning off transistor areas. The transistor areas contain polysilicon gates on silicon oxide gates, or gate oxides, over the silicon substrate. The silicon substrate on both sides of the polysilicon gate is slightly doped to become conductive. The lightly doped regions of the silicon substrate are referred to as "shallow source/drain junctions," which are separated by a channel region beneath the polysilicon gate. A curved silicon oxide or silicon nitride spacer, referred to as a "sidewall spacer", on the sides of the polysilicon gate allows deposition of additional doping to form more heavily doped regions of the shallow source/drain junctions, which are called "deep source/drain junctions". The shallow and deep source/drain junctions are collectively referred to as "S/D junctions."

To complete the transistor, a silicon oxide dielectric layer is deposited to cover the polysilicon gate, the curved spacer, and the silicon substrate. To provide electrical connections for the transistor, openings are etched in the silicon oxide dielectric layer to the polysilicon gate and the source/drain junctions. The openings are filled with metal to form electrical contacts. To complete the integrated circuits, the contacts are connected to additional levels of wiring in additional levels of dielectric material to the outside of the dielectric material.

In operation, an input signal to the gate contact to the polysilicon gate controls the flow of electric current from one source/drain contact through one source/drain junction through the channel to the other source/drain junction and to the other source/drain contact.

Transistors are fabricated by thermally growing a gate oxide layer on the silicon substrate of a semiconductor wafer and forming a polysilicon layer over the gate oxide layer. The oxide layer and polysilicon layer are patterned and etched to form the gate oxides and polysilicon gates, respectively. The gate oxides and polysilicon gates in turn are used as masks to form the shallow source/drain regions by ion implantation of boron or phosphorus impurity atoms into the surface of the silicon substrate. The ion implantation is followed by a high-temperature anneal above 700° C. to activate the implanted impurity atoms to form the shallow source/drain junctions.

A silicon nitride layer is deposited and etched to form sidewall spacers around the side surfaces of the gate oxides and polysilicon gates. The sidewall spacers, the gate oxides, and the polysilicon gates are used as masks for the conventional source/drain regions by ion implantation of boron or phosphorus impurity atoms into the surface of the silicon substrate into and through the shallow source/drain junctions. The ion implantation is again followed by a high-temperature anneal above 700° C. to activate the implanted impurity atoms to form the S/D junctions.

After formation of the transistors, a silicon oxide dielectric layer is deposited over the transistors and contact openings are etched down to the source/drain junctions and to the polysilicon gates. The contact openings are then filled with a conductive metal and interconnected by formation of conductive wires in other interlayer dielectric (ILD) layers.

As transistors have decreased in size, it has been found that the electrical resistance between the metal contacts and the silicon substrate or the polysilicon has increased to the level where it negatively impacts the performance of the transistors. To lower the electrical resistance, a transition material is formed between the metal contacts and the silicon substrate or the polysilicon. The best transition materials have been found to be cobalt silicide ($CoSi_2$), titanium silicide ($TiSi_2$), and nickel silicide (NiSi).

The silicides are formed by first applying a thin layer of the transition metal, such as cobalt, titanium, or nickel, on the silicon substrate above the source/drain junctions and the polysilicon gates. The semiconductor wafer is subjected to one or more annealing steps at temperatures above 800° C. and this causes the cobalt, titanium, or nickel to selectively react with the silicon and the polysilicon to form the metal silicide. The higher temperature annealing converts the relatively high resistance silicide to a low resistance phase. The high temperature annealing is sometimes referred to as the conversion rapid thermal anneal (conversion RTA).

The process is generally referred to as "siliciding." Since the shallow trench oxide and the sidewall spacers will not react to form a silicide, the silicides are aligned over the source/drain junctions and the polysilicon gates so the process is also referred to as "self-aligned siliciding," or "saliciding."

However, existing siliciding and saliciding have not succeeded in solving all the problems related to connecting metal contacts to silicon.

The problems include, but are not limited to, the conversion RTA is time consuming and creates a high thermal budget for transition materials. This is a problem when working with transition metals, such as nickel.

Solutions to these problems have been long sought but prior developments have not taught or suggested any solutions and, thus, solutions to these problems have long eluded those skilled in the art.

DISCLOSURE OF THE INVENTION

The present invention provides a method of forming an integrated circuit. A gate dielectric is formed on a semiconductor substrate, and a gate is formed on the gate dielectric. Source/drain junctions are formed in the semiconductor substrate. A transition metal layer is formed on the source/ drain junctions and on the gate. An interlayer dielectric is formed above the semiconductor substrate. Contacts are then formed in the interlayer dielectric, whereby a silicide is formed from the transition metal layer at a temperature no higher than the maximum temperature at which the interlayer dielectric and the contacts are formed. This method significantly lowers the electrical resistance between the contacts and the silicon or polysilicon greatly improving performance of the integrated circuit.

The present invention eliminates the high temperature conversion RTA thereby increasing manufacturing throughput and lowering the thermal budget for converting the transition metal to the silicide. A lower thermal budget for the conversion process allows the use of transition materials that have heretofore been difficult to use in forming silicides, such as nickel.

Additionally, the present invention results in reduced diffusion of the transition metal as well as any dopants.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 1 is a view of a transistor in an intermediate stage of fabrication in accordance with the present invention;

FIG. 2 is the structure of FIG. 1 with a liner layer deposited thereon;

FIG. 3 is the structure of FIG. 2 during ion implantation to form shallow source/drain junctions;

FIG. 4 is the structure of FIG. 3 after formation of a sidewall spacer;

FIG. 9 is a simplified flow chart of the method of manufacturing the silicide in accordance with the present invention.

DETAILED DESCRIPTION OF THE INVENTION

Figure 5:
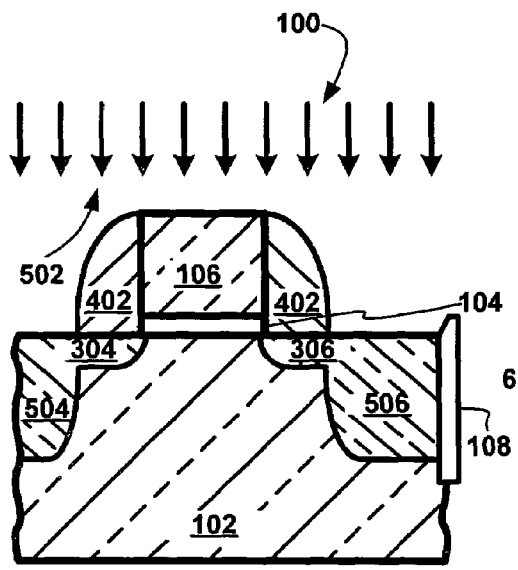
FIG. 5 is the structure of FIG. 4 during ion implantation to form deep source/drain junctions.

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail. In addition, the drawings showing embodiments of the apparatus are semi-diagrammatic and not to scale and, particularly, some of the dimensions are for the clarity of presentation and may be exaggerated in the drawing FIGs. The same numbers will be used in all the drawing FIGs. to relate to the same elements.

The term "horizontal" as used herein is defined as a plane parallel to a substrate or wafer. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Referring now to FIG. 1, therein is shown a transistor 100 in an intermediate stage of fabrication in accordance with the present invention.

To form the intermediate stage, a gate dielectric layer, such as silicon oxide, and a conductive gate layer, such as polysilicon, have been deposited on a semiconductor substrate 102 of a material such as silicon. The layers are patterned and etched to form a gate dielectric 104 and a gate 106. The semiconductor substrate 102 has been further patterned, etched, and filled with a silicon oxide material to form a shallow trench isolation (STI) 108.

Referring now to FIG. 2, therein is shown the structure of FIG. 1 having a liner layer 202 deposited thereon. The liner layer 202, generally of silicon oxide, covers the semiconductor substrate 102, the gate dielectric 104, the gate 106, and the STI 108. The liner layer 202 can be of an etch stop material or an implant-protection material.

Referring now to FIG. 3, therein is shown the structure of FIG. 2 during an ion implantation 302 to form shallow source/drain junctions 304 and 306.

The gate 106 and the gate dielectric 104 act as masks for the formation of shallow source/drain junctions 304 and 306 by the ion implantation 302 of boron (B) or phosphorus (P) impurity atoms into the surface of the semiconductor substrate 102. The ion implantation 302 is followed by a high-temperature anneal above 700° C. to activate the implanted impurity atoms to form the shallow source/drain junctions 304 and 306.

Referring now to FIG. 4, therein is shown the structure of FIG. 3 after formation of a curved sidewall spacer 402.

The liner layer 202, which protects from implant damage, has been removed and a sidewall spacer layer, generally of silicon nitride, has been deposited and etched to form the curved shape of the sidewall spacer 402.

Referring now to FIG. 5, therein is shown the structure of FIG. 4 during an ion implantation 502 to form deep source/drain junctions 504 and 506.

The sidewall spacer 402, the gate 106, and the STI 108, act as masks for the formation of the deep source/drain junctions 504 and 506 by the ion implantation 502 of boron or phosphorus impurity atoms into the surface of the semiconductor substrate 102 and into and through the shallow source/drain junctions 304 and 306, respectively. The ion implantation 502 is again followed by a high-temperature anneal above 700° C. to activate the implanted impurity atoms to form the source/drain junctions 504 and 506.

Figure 6:
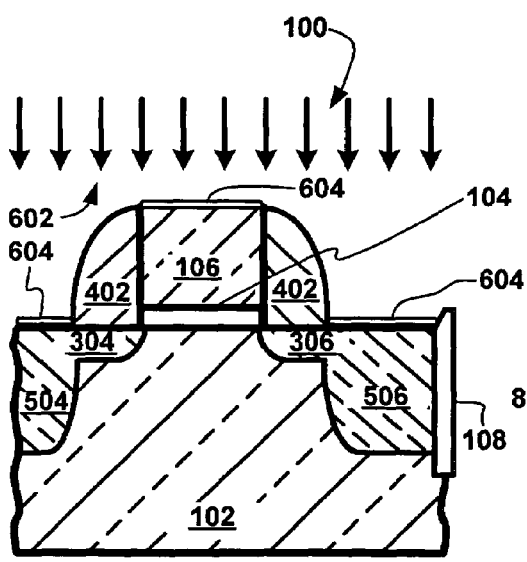
FIG. 6 is the structure of FIG. 5 during the formation of silicide.

Referring now to FIG. 6, therein is shown a deposition process 602 used in the formation of a transition metal layer 604 in accordance with the present invention. The transition metal layer 604 is formed over the surface of the semiconductor substrate 102, over the deep source/drain junctions 504 and 506, respectively, and the gate 106.

The transition metal layer 604 is formed by depositing a transition metal, such as a transition metal selected from the group consisting of cobalt, titanium, nickel, arsenic doped nickel, an alloy thereof, a compound thereof, and a combination thereof on the semiconductor substrate at a relatively low formation temperature, such as a formation RTA after deposition of the transition metal layer 604.

The formation RTA causes a reaction of the transition metal layer 604 with the source/drain junctions 504 and 506, but not the sidewall spacer 402. Thus, the transition metal layer 604 is self-aligned over the source/drain junctions 504 and 506.

The transition metal layer 604 is removed from the sidewall spacer 402 using conventional semiconductor processing techniques, such as by a wet strip of the portion of the transition metal layer 604 from the spacer 402. The transition metal layer specifically does not undergo a high temperature conversion RTA, such as an RTA at 700° C. for about 30 seconds, at this point in the manufacturing process thereby eliminating this conventional processing step. The transition metal layer 604 is converted to the silicide layers 604, 606, and 608 later in the manufacturing process as described below with reference to FIG. 8

The silicide 604, 606, 608 preferably is formed of a metal selected from the group consisting of cobalt, titanium, nickel, arsenic doped nickel, an alloy thereof, a compound thereof, and a combination thereof.

Conventional salicidation processes have become problematic with modern semiconductor devices that have shallow source/drain junctions, e.g., junction depths on the order of 1000 Angstroms (Å). In particular, during such salicidation processes, some of the existing source/drain regions are consumed.

When cobalt is used as the refractory metal, it consumes about twice its thickness of silicon in the process of being converted to a metal silicide, e.g., a 100 Å layer of cobalt consumes about 103 Å of silicon. Such consumption acts to reduce the dopant present in the source/drain junctions and may adversely impact the electrical performance characteristics of the source/drain junctions, and ultimately, degrades the performance of the integrated circuit.

When the refractory metal is titanium, titanium silicide forms between metal contacts because the sidewall spacer becomes smaller with smaller integrated circuits thereby allowing a capacitive-coupled or fully conductive path between the polysilicon gate and the source/drain junctions, and similarly, degrades the performance of the integrated circuit.

While the present invention may be used with various refractory metal silicides, it has been found that nickel silicide has many desirable characteristics. However, in working with nickel silicide, it has been found to be difficult to form robust nickel. It has been thought that thick silicides around 100 Å thick with rough surfaces would best protect the silicon substrate and provide good adhesion.

However, an ultra-uniform nickel silicide can form extremely robust nickel silicide. By definition, an ultra-uniform silicide means a layer of silicide where there are no variations in thickness greater than about 3% of the overall thickness.

One example of forming ultra-uniform nickel ultra-uniform suicides 604, 606, and 608, is by depositing the nickel on the exposed silicon areas by a very low power vapor deposition process, where the very low power means a power level below 500 watts direct current and preferably between about 400 and 300 watts direct current.

In addition, an extra slow rate of metal deposition is preferred, which is defined to be below 7.0 Å per second and preferably between about 6.8 and 6.0 Å per second.

Still further, it is preferable that the silicide be deposited under these power levels and deposition rates to an ultra-thin thickness of not more than 50 Å thickness in order to provide an ultra-uniform, ultra-thin silicide. The deposited silicide metal is then converted to a silicide by an annealing process, such as an anneal at a temperature no higher than 500° C.

Figure 7:
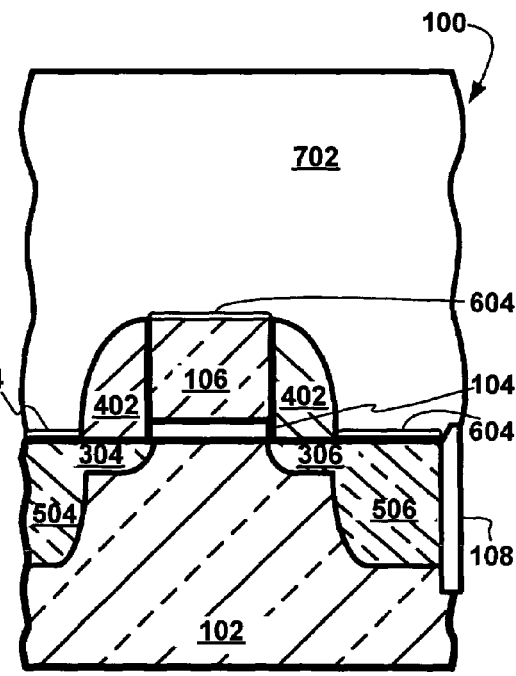
FIG. 7 is the structure of FIG. 6 after deposition of a dielectric layer over the silicide, the sidewall spacer, and shallow trench isolation.

Referring now to FIG. 7, therein is shown the structure of FIG. 6 after deposition of a dielectric layer 702 over the transition metal layer 604 the sidewall spacer 402, and the STI 108.

In various embodiments, the dielectric layers 702 are of dielectric materials such as silicon oxide ($SiO_x$), tetraethylorthosilicate (TEOS), borophosphosilicate (BPSG) glass, etc. with medium dielectric constants from 4.2 to 3.9 or low dielectric constant dielectric materials such as fluorinated tetraethylorthosilicate (FTEOS), hydrogen silsesquioxane (HSQ), bis-benzocyclobutene (BCB), tetramethylorthosilicate (TMOS), octamethyleyclotetrasilloxane (OMCTS), hexamethyldisiloxane (HMDS), trimethylsilil borxle (SOB), diaceloxyditerliarybutosiloxane (DADBS), trimethylsilil phosphate (SOP), etc. with dielectric constants below 3.9 to 2.5. Ultra-low dielectric constant dielectric materials, having dielectric constants below 2.5 and which are available, include commercially available Teflon-AF, Teflon microemulsion, polimide nanofoams, silica aerogels, silica xerogels, and mesoporous silica. Stop layers and capping layers (where used) are of materials such as silicon nitride ($Si_xN_x$) or silicon oxynitride (SiON).

Figure 8:
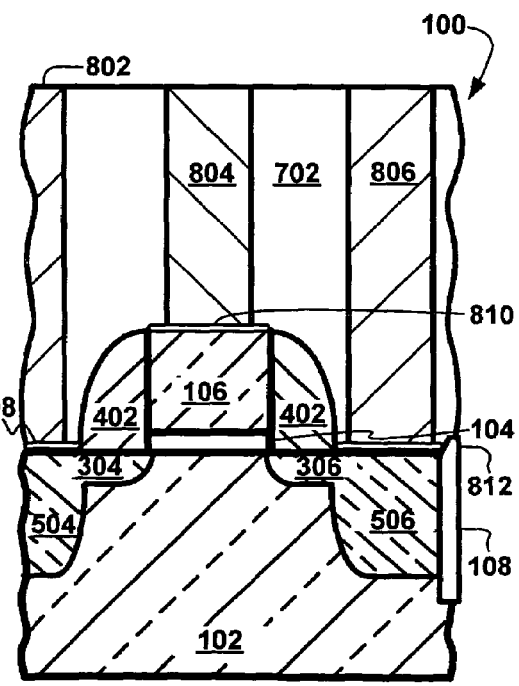
FIG. 8 is the structure of FIG. 7 after formation of metal contacts.

Referring now to FIG. 8, therein is shown the structure of FIG. 7 after formation of metal contacts 802, 804, and 806.

The metal contacts 802, 804, and 806 are respectively electrically connected to the silicide layers 604, 606, and 608, and respectively to the deep source/drain junction 504, the gate 106, and the deep source/drain junction 506.

In various embodiments, the metal contacts 802, 804, and 806 are of metals such as tantalum (Ta), titanium (Ti), tungsten (W), alloys thereof, and compounds thereof. In other embodiments, the metal contacts 802, 804, and 806 are of metals such as copper (Cu), gold (Au), silver (Ag), alloys thereof, and compounds thereof with one or more of the above elements with diffusion barriers around them.

It has been discovered that the thermal processes typically used in the back end manufacture of the integrated circuit 100 are sufficient to convert the transition metal layer 604 to the silicide layers 808, 810, and 812 without subjecting the transition metal layer 604 to the conventional second high temperature conversion RTA discussed above with reference to FIG. 6. The present invention converts the transition metal layer 604 to a silicide 808, 810, and 810 at a temperature that is no higher than about the maximum temperature at which the interlayer dielectric 702 and the metal contacts 802, 804, and 806 are formed. Elimination of the high temperature conversion RTA results in several benefits.

Manufacturing throughput is increased by eliminating the high temperature RTA thereby reducing the cost of manufacturing integrated circuits.

The thermal budget after formation of the transition metal layers can be lowered to no higher than the maximum back end thermal step, thereby allowing transition metals to be used to form the silicide layers 808, 810, and 812 that have heretofore been difficult to use due to thermal budget considerations. The maximum backend thermal process step typically is performed at a temperature in the range of less than about 450° C. to 500° C., which is significantly lower than the temperature of the conversion RTA (upwards of 700° C.) that is eliminated in accordance with the present invention.

Consequently, diffusion of the transition metal layer 604 into the semiconductor substrate 102 and the gate 106 to form the silicide 808, 810, and 812 as well as the diffusion of any dopants is reduced.

It should also be noted that although the formation of the silicide 808, 810, and 812 is shown herein as occurring in the formation of the metal contacts 802, 804, and 806, the conversion process will occur after formation of the transition metal layer 604 at any subsequent point in the manufacturing process at which the appropriate temperature is attained. For example, the conversion process can also occur, or begin, during the formation of the interlayer dielectric 702 shown and described in FIG. 7.

Referring now to FIG. 9, therein is shown a simplified flow chart of a method 900 in accordance with the present invention. The method 900 includes: providing a semiconductor substrate in a step 902; forming a gate dielectric on the semiconductor substrate in a step 904; forming a gate on the gate dielectric in a step 906; forming source/drain junctions in the semiconductor substrate in a step 908; forming a transition metal layer on the source/drain junctions and on the gate in a step 910; forming an interlayer dielectric above the semiconductor substrate in a step 912; and forming contacts in the interlayer dielectric, whereby a silicide is formed from the transition metal layer at a temperature no higher than about the maximum temperature at which the interlayer dielectric and the contacts are formed in a step 914.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of forming an integrated circuit comprising:
providing a semiconductor substrate;
forming a gate dielectric on the semiconductor substrate;
forming a gate on the gate dielectric;
forming source/drain junctions in the semiconductor substrate;
forming a transition metal layer having a thickness of less than about 50 Angstroms on the source/drain junctions and on the gate using a deposition rate less than about seven Angstroms per second;
forming an interlayer dielectric above the semiconductor substrate; and
forming contacts in the interlayer dielectric, whereby a silicide is formed from the transition metal layer during formation of the interlayer dielectric and the contacts at a temperature no higher than about 500° C.

2. The method as claimed in claim 1 wherein:
depositing the interlayer dielectric deposits a dielectric material having a dielectric constant from about 2.5 to about 4.2.

3. The method as claimed in claim 1 wherein:
forming the contacts in the interlayer dielectric uses materials selected from at least one of tantalum, titanium, tungsten, copper, gold, silver, an alloy thereof, a compound thereof, and a combination thereof.

4. The method as claimed in claim 1 wherein forming the transition metal layer is formed at a temperature lower than the conversion rapid thermal anneal temperature for the transition metal.

5. The method as claimed in claim 1 wherein forming the transition metal layer forms a layer of a material selected from at least one of cobalt, titanium, nickel, arsenic doped nickel, an alloy thereof, a compound thereof, and a combination thereof.

6. A method of forming a silicide in an integrated circuit comprising:
forming source/drain junctions in the semiconductor substrate;
forming a transition metal layer having a thickness of less than about 50 Angstroms on the source/drain junctions using a deposition rate less than about seven Angstroms per second;
forming an interlayer dielectric above the source/drain junctions; and
forming contacts in the interlayer dielectric, whereby a silicide is formed from the transition metal layer during formation of the interlayer dielectric and the contacts at a temperature no higher than about 500° C.

7. The method as claimed in claim 6 wherein:
depositing the interlayer dielectric deposits a dielectric material having a dielectric constant from about 2.5 to about 4.2.

8. The method as claimed in claim 6 wherein:
forming the contacts in the interlayer dielectric uses materials selected from at least one of tantalum, titanium, tungsten, copper, gold, silver, an alloy thereof, a compound thereof, and a combination thereof.

9. The method as claimed in claim 6 wherein forming the transition metal layer is formed at a temperature lower than the conversion rapid thermal anneal temperature for the transition metal.

10. The method as claimed in claim 6 wherein forming the transition metal layer forms a layer of a material selected from at least one of cobalt, titanium, nickel, arsenic doped nickel, an alloy thereof, a compound thereof, and a combination thereof.

* * * * *